United States Patent
Watanabe et al.

(10) Patent No.: US 7,842,966 B2
(45) Date of Patent: Nov. 30, 2010

(54) COMPOUND SEMICONDUCTOR LIGHT-EMITTING DIODE AND METHOD FOR FABRICATION THEREOF

(75) Inventors: Takashi Watanabe, Chichibu (JP); Ryouichi Takeuchi, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 11/994,710

(22) PCT Filed: Jul. 5, 2006

(86) PCT No.: PCT/JP2006/313800

§ 371 (c)(1),
(2), (4) Date: Feb. 19, 2008

(87) PCT Pub. No.: WO2007/004741

PCT Pub. Date: Jan. 11, 2007

(65) Prior Publication Data

US 2009/0121242 A1 May 14, 2009

Related U.S. Application Data

(60) Provisional application No. 60/700,346, filed on Jul. 19, 2005.

(30) Foreign Application Priority Data

Jul. 6, 2005 (JP) .............................. 2005-197009

(51) Int. Cl.
*H01L 31/00* (2006.01)

(52) U.S. Cl. .................. 257/103; 257/96; 257/E31.105; 257/E25.032

(58) Field of Classification Search .................... 257/96, 257/103, E31.105, E25.032; 438/FOR. 157
See application file for complete search history.

(56) References Cited

U.S. PATENT DOCUMENTS

| 5,574,744 | A | * | 11/1996 | Gaw et al. ................ 372/50.21 |
| 5,904,860 | A | * | 5/1999 | Nagakubo et al. ............. 216/34 |
| 6,465,890 | B1 | | 10/2002 | Poddar et al. |
| 6,528,823 | B2 | * | 3/2003 | Akaike et al. ................. 257/79 |

(Continued)

FOREIGN PATENT DOCUMENTS

JP     6-296040     10/1994

(Continued)

OTHER PUBLICATIONS

Morisawa et al. in Applied Surface Science, v. 92, Feb. 1996, pp. 147-150.*

(Continued)

*Primary Examiner*—Fernando L Toledo
(74) *Attorney, Agent, or Firm*—Sughrue Mion, PLLC

(57) ABSTRACT

A compound semiconductor light-emitting diode includes a light-emitting layer (133) formed of aluminum-gallium-indium phosphide, a light-emitting part (13) having component layers individually formed of a Group III-V compound semiconductor, a transparent supporting layer (14) bonded to one of the outermost surface layers (135) of the light-emitting part (13) and transparent to the light emitted from the light-emitting layer (133), and a bonding layer (141) formed between the supporting layer (14) and the one of the outermost surface layers (135) of the light-emitting part (13) containing oxygen atoms at a concentration of $1 \times 10^{20}$ cm$^{-3}$ or less.

6 Claims, 4 Drawing Sheets

U.S. PATENT DOCUMENTS

| | | |
|---|---|---|
| 6,709,883 B2 | 3/2004 | Yang et al. |
| 6,815,312 B2 | 11/2004 | Furukawa et al. |
| 7,087,933 B2 * | 8/2006 | Takeda et al. ............. 257/94 |
| 7,087,941 B2 * | 8/2006 | Gardner et al. ............ 257/200 |
| 2002/0036296 A1 | 3/2002 | Akaike et al. |
| 2002/0185648 A1 | 12/2002 | Furukawa et al. |
| 2004/0009649 A1 * | 1/2004 | Kub et al. ................ 438/459 |
| 2005/0066880 A1 | 3/2005 | Furukawa et al. |
| 2005/0173695 A1 | 8/2005 | Song et al. |
| 2006/0220031 A1 * | 10/2006 | Krames et al. ............. 257/79 |
| 2007/0166967 A1 * | 7/2007 | Ichinose et al. ........... 438/510 |

FOREIGN PATENT DOCUMENTS

| | | | |
|---|---|---|---|
| JP | 6-302857 | | 10/1994 |
| JP | 8-130326 | | 5/1996 |
| JP | 08264478 | A | 10/1996 |
| JP | 2588849 | | 12/1996 |
| JP | 10-012506 | A | 1/1998 |
| JP | 11-354633 | A | 12/1999 |
| JP | 2000-196139 | A * | 7/2000 |
| JP | 2001-57441 | | 2/2001 |
| JP | 2001-057441 | A | 2/2001 |
| JP | 3230638 | | 9/2001 |
| JP | 2002-111052 | A | 4/2002 |
| JP | 2002-246640 | | 8/2002 |
| JP | 2003-297855 | A | 10/2003 |
| JP | 2004-103833 | A | 4/2004 |
| JP | 2004-207500 | A | 7/2004 |
| JP | 2004-247431 | A | 9/2004 |
| JP | 2005-024826 | A | 1/2005 |
| JP | 2005-079152 | A | 3/2005 |

OTHER PUBLICATIONS

Ookawa et al. In JSME Int. Journal Series C, vol. 47 (2004), No. 1, Special Issue on Advanced Manufacturing Technology, pp. 98-104.*

Morisawa et al. Applied Surface Science, v. 92, Feb. 1996, pp. 147-150.*

Ookawa et al. JSME Int. Journal, Series C, v. 47 (2004), No. 1, Special Issue on Advanced Manufacturing Technology, pp. 98-104.*

Razek et al. (J. Vacuum Sci. Technol., A, v. 20. issue 4, pp. 1492-1497).*

Ishikawa Hironori, Kagobutsuhandotaiuehanosec-chakuhohooyobisochi, Toshiba gijutsu kokaishu, Oct. 29, 2001, pp. 123-126, vol. 19-55.

Ishikawa Hironori, Kagobutsuhandotaiuehanosec-chakuhohooyobisochi, Toshiba gijutsu kokaishu, Oct. 29, 2001, pp. 123-126, vol. 19-55, Abstract.

"Semiconductors and Semimetals"; vol. 48; edited by G.B. Stringfellow et al.; published 1997 by Academic press (U.S.A.); pp. 196-207.

Y. Hosokawa, et al.; "High-power ohmic-electrodes dispersive AlGaInP double-hetero structure yellowish-green light-emitting diodes"; Journal of Crystal Growth; vol. 221; (2000); pp. 652-656.

* cited by examiner

COMPOUND SEMICONDUCTOR LIGHT-EMITTING DIODE AND METHOD FOR FABRICATION THEREOF

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/700,346 filed Jul. 19, 2005 and Japanese Patent Application No. 2005-197009 filed Jul. 6, 2005 pursuant to 35 U.S.C. §111(b).

TECHNICAL FIELD

This invention relates to a compound semiconductor light-emitting diode including a light-emitting layer formed of aluminum-gallium-indium phosphide $((Al_xGa_{1-x})_yIn_{1-y}P$ wherein $0 \leq X \leq 1$ and $0 < Y \leq 1$) and, as well, having component layers individually provided with a light-emitting part formed of a Group III-V compound semiconductor and a transparent support layer bonded to one of the outermost surface layers of the light-emitting part and transparent to the light emitted from the light-emitting layer and to a method for the fabrication thereof

BACKGROUND ART

As a light-emitting diode (LED) that emits a visible light in a red, orange, yellow or yellowish green color, the compound semiconductor LED provided with a light-emitting layer formed of aluminum-gallium-indium phosphide $((Al_xGa_{1-x})_yIn_{1-y}P$ wherein $0 \leq X \leq 1$ and $0 < Y \leq 1$) has been known heretofore. In the LED of this configuration, generally the light-emitting part provided with a light-emitting layer formed of $(Al_xGa_{1-x})_yIn_{1-y}P$ ($0 \leq X \leq 1$, $0 < Y \leq 1$) is optically nontransparent to the light emitted from the light-emitting layer and is formed on the substrate of a material, such as gallium arsenide (GaAs), which has no appreciably high strength.

Recently, therefore, for the purpose of obtaining a visible LED exhibiting enhanced luminance and with the object of further enhancing the mechanical strength as a device, a technique for configuring a junction-type LED by removing a nontransparent substrate material, such as GaAs, and thereafter bonding anew a support layer formed of a material transparent to the emitted light and excellent in mechanical strength more than ever has been developed. The transparent supporting layer, such as a Group III-V compound semiconductor crystal substrate, for example, is ordinarily disposed as bonded to the surface of a buffer (barrier) layer and not to the surface exposed by the removal of a nontransparent substrate, such as a layer forming a light-emitting part.

As means for effecting adhesion of a transparent supporting layer, the following methods (1) to (5) have been known heretofore.
(1) A method for directly bonding the supporting layer to a semiconductor layer while applying pressure thereto at an elevated temperature of several hundred degrees (refer to Japanese Patent No. 3230638).
(2) A method for effecting bonding by a means called wafer bonding (refer to JP-A HEI 6-302857).
(3) A method utilizing a transparent adhesive substance, such as epoxy resin (refer to JP-A 2002-246640).
(4) A method for bonding a semiconductor layer and the transparent supporting layer through a transparent electrically conductive thin film, such as of an indium-tin complex oxide (ITO) (refer to Japanese Patent No. 2588849).
(5) A method comprising the steps of mirror-polishing both a semiconductor layer and a supporting layer, bonding the two layers after removal of defiling matter and heat-treating the bonded layers (refer to JP-A 2001-57441).

The technical means of (1) which attempts to bond a transparent supporting layer directly to the surface of a semiconductor, however, necessitates elevation of temperature to a high level of 600° C. or more and application of pressure as well ("Semiconductors and Semimetals," Vol. 48, edited and written by G. B. Stringfellow and M. George Craford (published in 1997 by Academic Press (U.S.A.)), refer to pp. 196-206). An attempt to bond a transparent supporting layer under such conditions of high temperature and high pressure leads to inducing a disadvantage in easily inflicting a crystal defect on the supporting layer because stress is exerted, for example, on a Group III-V compound semiconductor layer which possesses brittleness. When the surface of the Group III-V compound semiconductor layer to be bonded, for example, is not flat, the pressure is unevenly applied to the layer, with the result that the bonded layers will frequently form such union as is inferior in quality and deficient in strength. Further, the disadvantage of the conventional means of bonding under the conditions of high temperature and high pressure consists in the fact that an effort to bond a supporting layer which reveals difference in thermal expansion coefficient results in inducing a warp due to mechanical stress and eventually entailing occurrence of crystal defects in a large amount in the interface of union.

The bond produced by the wafer bonding means of (2), being formed with a transparent supporting layer and a Group III-V compound semiconductor layer, for example, is at a disadvantage in suffering the presence of an oxide film on the surfaces of the layers being bonded or the contamination caused by a pasting agent used for bonding to degrade strength of union and aggravate electric resistance in the interface of union. In the LED, therefore, the expected decrease of the forward voltage (Vf), for example, encounters a hindrance.

Meanwhile, the bonding means of applying or inserting a viscous adhesive material, such as epoxy resin of (3) or a transparent electrically conductive thin film of (4), between the supporting layer and the semiconductor layer being bonded, in spite of being able to lower the temperature necessary for the bonding, is at a disadvantage in suffering the intervention of a foreign material, such as the epoxy resin layer, in the interface of union to inflict the stress due to the difference in thermal expansion coefficient on the Group III-V compound semiconductor layer, and consequently induce the leak of the electric current for operating the device (device operating current) via the crystal grain boundaries generated by the stress, and prevent the junction-type compound semiconductor LED abounding in reverse voltage from being obtained with fully satisfactory stability.

Particularly, in the compound semiconductor LED, when a transparent supporting layer gaining in thickness in the direction of flow of the device operating current and additionally performing an action of diffusing the device operating current throughout the whole mass of the light-emitting layer is disposed as bonded to the LED, the difference in thermal expansion coefficient between the transparent supporting layer and the adhesive material induces separation of the transparent supporting layer from the adhesive material conspicuously. This bonding means, as compared with the means of directly bonding them together without daring use of an adhesive material, poses a problem that the transparent supporting layer cannot be bonded to the light-emitting part with fully satisfactory strength and the junction-type LED cannot be fabricated with fully satisfactory stability.

Then, the surface cleaning of (5) which resorts to mirror polishing, removal of defiling matter or the like requires a highly advanced cleaning technique and subsequently necessitates an environment of cleanliness exceptionally high enough to avoid re-contamination and renders stable fabrication difficult to achieve. Further, adjustment of the environment entails a problem of adding to the burden of cost.

This invention has been proposed in view of the foregoing state of affairs and is aimed at providing a compound semiconductor light-emitting diode capable of suppressing the occurrence of a crystal defect without exerting stress on a light-emitting part, enhancing the bonding strength between the light-emitting part and a supporting layer, further decreasing electric resistance in the interface of union and improving the forward voltage (Vf), heightening also the reverse voltage, and realizing enhancement of luminance and at providing a method for the fabrication thereof.

DISCLOSURE OF THE INVENTION

With a view to accomplishing the object mentioned above, the first aspect of the invention is directed to a compound semiconductor light-emitting diode comprising a light-emitting layer formed of aluminum-gallium-indium phosphide $((Al_XGa_{1-X})_YIn_{1-Y}P$ wherein $0 \leq X \leq 1$ and $0 < Y \leq 1$), component layers individually having a light-emitting part formed of a Group III-V compound semiconductor, a transparent supporting layer bonded to one of the outermost surface layers of the light-emitting part and transparent to the light emitted from the light-emitting layer, and a bonding layer formed between the supporting layer and the one of the outermost surface layers of the light-emitting part and containing oxygen atoms at a concentration of $1 \times 10^{20}$ cm$^{-3}$ or less.

In the second aspect of the invention, besides fulfilling the configuration of the first aspect of the invention, the bonding layer formed between the supporting layer and one of the outermost surface layers of the light-emitting part contains carbon atoms at a concentration of $1 \times 10^{20}$ cm$^{-3}$ or less.

In the third aspect of the invention, besides fulfilling the configuration of the first or second aspect of the invention, the one of the outermost surface layers of the light-emitting part has a different lattice constant from the other component layers of the light-emitting part and has a thickness of 0.5 µm or more and 20 µm or less.

In the fourth aspect of the invention, besides fulfilling the configuration of any one of the first to third aspects of the invention, the supporting layer and the one outermost surface layer of the light-emitting part are both formed of gallium phosphide (GaP).

In the fifth aspect of the invention, besides fulfilling the configuration of the fourth aspect of the invention, the bonding layer has a nonstoichiometric composition, represented by the formula $Ga_XP_{1-X}$ wherein $0.5 < X < 0.7$.

In the sixth aspect of the invention, besides fulfilling the configuration of any one of the first to fifth aspects of the invention, the bonding layer has a thickness of 0.5 nm or more and 5 nm or less.

In the seventh aspect of the invention, besides fulfilling the configuration of any one of the first to sixth aspects of the invention, a first electrode is formed on the other outermost surface layer of the light-emitting part, a second electrode is formed on the surface of the supporting layer, the first electrode comprises a transparent, electrically conductive film formed on an ohmic electrode, and a bonding electrode is formed on the transparent, electrically conductive film.

The eighth aspect of the invention is directed to a method for the fabrication of a compound semiconductor light-emitting diode including a light-emitting layer formed of aluminum-gallium-indium phosphide $((Al_XGa_{1-X})_YIn_{1-Y}P$ wherein $0 \leq X \leq 1$ and $0 < Y \leq 1$) and, as well, having component layers individually possess a light-emitting part formed of a Group III-V compound semiconductor and a transparent supporting layer bonded to one of the outermost surface layers of the light-emitting part and transparent to the light emitted from the light-emitting layer, which method comprises the steps of growing the component layers on a substrate to form the light-emitting part, polishing the light-emitting part by mirror-polishing the surfaces of the outermost surface layers of the light-emitting part till average roughness of 0.3 nm or less, preparing the supporting layer separately of the light-emitting part, irradiating at least either of the outermost surface of the light-emitting part and the surface of the supporting layer in a vacuum with atoms or ions possessing an energy of 50 eV or more, and bonding the surface of the outermost layer of the light-emitting part and the surface of the supporting layer.

In the ninth aspect of the invention, besides fulfilling the configuration of the eighth aspect of the invention, the surface of the supporting layer is mirror-polished to 0.3 nm or less in the root-mean-square value.

In the tenth aspect of the invention, besides fulfilling the configuration of the eighth or ninth aspect of the invention, the atom or ion irradiated in the irradiating step is one member selected from the group consisting of a hydrogen atom (H), a hydrogen molecule ($H_2$) and a hydrogen ion ($H^+$).

In the eleventh aspect of the invention, besides fulfilling the configuration of the eighth or ninth aspect of the invention, the atom or ion in the irradiating step is one or more members selected from the group consisting of helium (He), neon (Ne), argon (Ar) and krypton (Kr).

In the twelfth aspect of the invention, besides fulfilling the configuration of any one of the eighth to eleventh aspects of the invention, the bonding step is performed at room temperature or more and 100° C. or less.

In the thirteenth aspect of the invention, besides fulfilling the configuration of the eighth aspect of the invention, at least either of the surface of the outermost layer of the light-emitting part and the surface of the supporting layer is subjected to a wet or dry etching treatment.

In the fourteenth aspect of the invention, besides fulfilling the configuration of any one of the eighth to thirteenth aspects of the invention, the method further comprises a step of removing the substrate from the light-emitting part.

According to this invention, since the concentration of oxygen atoms in the bonding layer formed between the supporting layer and one of the outermost surface layers of the light-emitting part is set at $1 \times 10^{20}$ cm$^{-3}$ or less, the supporting layer and the one outermost surface layer of the light-emitting part can be bonded fast. Further, the introduction of a crystal defect into the light-emitting part can be suppressed and consequently the uncalled-for addition to the electric resistance in the direction of flow of the device operating current can be avoided. As a result, a compound semiconductor light-emitting diode that shows a low forward voltage (Vf) and a small leak current via crystal defect as well and abounds in reverse voltage, for example, can be configured.

According to this invention, since one of the outermost surface layers of the light-emitting part has a different lattice constant from the other component layers of the light-emitting part and has a thickness of 0.5 µm or more and 20 µm or less, the infliction of distortion on the other component layers of the light-emitting part can be prevented by the function of the outermost surface layer discharged toward allaying stress.

According to this invention, since the supporting layer and one of the outermost surface layers of the light-emitting part are both formed of gallium phosphide (GaP), the bonding strength can be enhanced by the equality of material and the transmission of the light emitted from the light-emitting part can be realized, with the result that a compound semiconductor light-emitting diode that excels in the efficiency of extraction of the emitted light to the exterior will be provided.

According to this invention, since the gallium phosphide (GaP) in one of the outermost surface layers of the light-emitting part is made to assume a nonstoichiometric composition, represented by formula $Ga_XP_{1-X}(0.5<X<0.7)$, the introduction of distortion into the light-emitting part can be avoided and the supporting layer and one of the outermost surface layers of the light-emitting part can be bonded fast.

According to this invention, since the bonding layer possesses a composition different from gallium phosphide (GaP) and a thickness of 0.5 nm or more and 5 nm or less, the supporting layer and one of the outermost surface layers of the light-emitting part can be bonded fast.

According to this invention, since a first electrode is formed on the other outermost surface layer of the light-emitting part, a second electrode is formed on the surface of the supporting layer, the first electrode is composed of a transparent, electrically conductive film formed on an ohmic electrode and a bonding electrode is formed on the transparent, electrically conductive film, a compound semiconductor light-emitting diode of high luminance can be easily provided.

According to this invention, since the surface of the outermost surface layer of the light-emitting part is mirror-polished to average roughness of 0.3 nm or less and, as well, the surface of the outermost surface layer of the light-emitting part and the surface of the supporting layer are bonded by dint of the irradiation of at least either of the surface of the outermost surface layer of the light-emitting part and the surface of the supporting layer in vacuum with an atom or ion possessing energy of 50 eV or more, a strong bond can be formed by mutually bonding the polished flat surfaces, the surfaces being bonded can be activated and an impurity layer and a polluting layer existing on the surfaces being bonded can be removed by irradiating the flat surfaces with the atom or ion, and consequently the transparent supporting layer can be strongly bonded directly to the light-emitting part.

According to this invention, since the surface of the supporting layer is mirror-polished to 0.3 nm or less in the root-mean-square value, the surface of the supporting layer can be made to gain further in flatness and the bond thereof to the outermost surface layer of the light-emitting part can be made to gain in strength.

According to this invention, since the bonding in the bonding step is carried out at room temperature or more and 100° C. or less, the transparent supporting layer can be directly bonded to the light-emitting part without entailing uncalled-for impartation of distortion and a compound semiconductor light-emitting diode of high luminance can be fabricated stably.

Besides, according to this invention, since at least either of the surface of the outermost surface layer of the light-emitting part and the surface of the supporting layer is subjected to a wet or dry etching treatment, the surface can be further improved in flatness and can be cleaned as well by the removal of foreign matter or polluting matter adhering thereto.

Furthermore, according to this invention, since the transparent supporting layer is directly bonded to the light-emitting part and thereafter the substrate previously used for the formation of the light-emitting part is removed, the absorption of the light emitted from the light-emitting part by the substrate can be avoided and, as a result, a compound semiconductor light-emitting diode of high luminance can be fabricated.

The above and other objects, characteristic features and advantages of the present invention will become apparent to those skilled in the art from the description to be made herein below with reference to the accompanying drawings.

BEST MODE OF CARRYING OUT THE INVENTION

Figure 1:
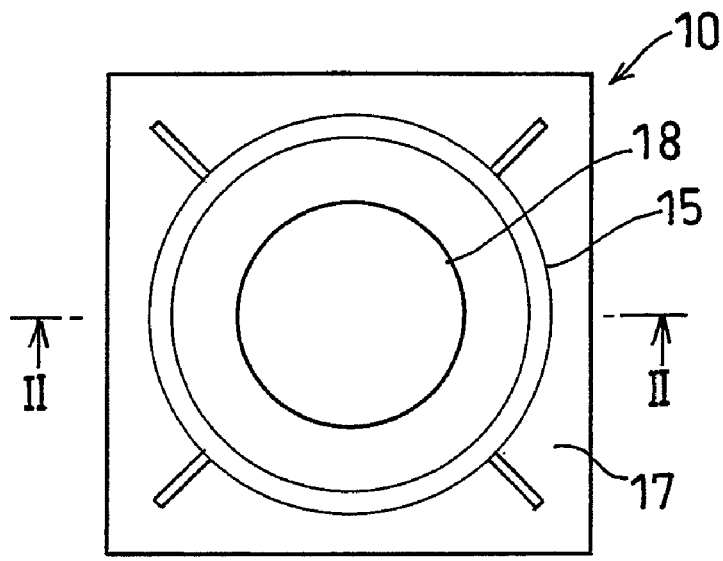
FIG. 1 is a plan view illustrating a schematic plan view of the semiconductor light-emitting diode manufactured in the example.

The light-emitting part according to this invention is a region which contains a light-emitting layer formed of $(Al_XGa_{1-X})_YIn_{1-Y}P$ ($0 \leq X \leq 1$, $0 < Y \leq 1$) and discharges the function of emitting light. The light-emitting layer can be formed of $(Al_XGa_{1-X})_YIn_{1-Y}P$; ($0 \leq X \leq 1, 0 < Y \leq 1$) in the form of conduction of either the n-type or the p-type. Though the light-emitting layer may be in either of the structures of single quantum well (SQW) and multiquantum well (MQW), it is preferably in the MQW structure for the purpose of obtaining an emitted light excelling in monochromaticity. The barrier layer constituting a quantum well (QW) structure and the composition of $(Al_XGa_{1-X})_YIn_{1-Y}P$ ($0 \leq X \leq 1, 0 \leq Y \leq 1$) constituting a well layer are so decided that the quantum level destined to fix an expected wavelength of the emitted light may be formed in the well layer.

The light-emitting part, most preferably for the sake of acquiring light emission of high intensity, is formed in the so-called double hetero (DH) structure which is composed of the light-emitting layer and clad layers disposed as opposed to the opposite sides of the light-emitting layer with the object of confining in the light-emitting layer the carrier and the light emission responsible for radiation recombination. The clad layers are preferably formed of a semiconductor material having a larger forbidden band width and a higher refractive index than the compound $(Al_XGa_{1-X})_YIn_{1-Y}P$ ($0 \leq X \leq 1$, $0 < Y \leq 1$) forming the light-emitting layer. As regards the light-emitting layer which is formed of $(Al_{0.4}Ga_{0.6})_{0.5}In_{0.5}P$ capable of emitting a yellowish green color with a wavelength of about 570 nm, for example, the clad layers are formed of $(Al_{0.7}Ga_{0.3})_{0.5}In_{O.5}P$ (Y. Hosakawa et at., J. Crystal Growth, 221 (2000), pp. 652-656). It is permissible to have interposed between the light-emitting layer and the clad layers such intermediate layers as are intended to change moderately the discontinuity of a band between these layers. In this case, it is preferable to have the intermediate layers formed of a semiconductor material that possesses a forbidden band width intermediating between the light-emitting layer and the clad layers.

In the compound semiconductor light-emitting diode comprising a light-emitting layer formed of aluminum-gallium-indium phosphide $((Al_XGa_{1-X})_YIn_{1-Y}P$ wherein $0 \leq X \leq 1$, $0 \leq Y \leq 1$), component layers individually having a light-emitting part formed of a Group III-V compound semiconductor and a transparent supporting layer bonded to one of the outermost surface layers of the light-emitting part and transparent to the light emitted from the light-emitting layer, this invention contemplates setting the concentration of oxygen atoms in a bonding layer formed between the supporting layer and one of the outermost surface layers of the light-emitting part at $1 \times 10^{20}$ cm$^{-3}$ or less and the concentration of carbon atoms in the bonding layer at $1 \times 10^{20}$ cm$^{-3}$ or less.

What is essential first of all in the case of bonding the transparent supporting layer to the outermost surface layer of the Group III-V compound semiconductor layer, i.e. a layer partaking in the construction of the light-emitting part, is the surface treatment of the outermost surface layer on the side of the light-emitting part about to have the supporting layer bonded thereto. Particularly, a means of surface treatment that is intended to remove an oxide film is necessary. As a method of surface treatment proper for gallium phosphide (GaP), for example, the method of wet treatment that resides in immersing a given surface in hydrofluoric acid (HF) may be cited. Also, the method which consists in immersing a surface in a mixed liquid containing sulfuric acid ($H_2SO_4$) or phosphoric acid ($H_3PO_4$) and subsequently giving the surface a final surface treatment with a solution containing HCl may be cited. The dry etching method using an inert gas, such as argon (Ar), is available as a means for removing an oxide film existing on the surface of GaP. GaP, for example, can be investigated by determining the existence of a signal caused by the chemical bond of gallium (Ga) with oxygen (O) or of phosphorus (P) with oxygen by means of analysis, such as infrared (IR) absorption spectroscopy or Electron Spectroscopy for Chemical Analysis (ESCA).

The bonding strength between the outermost surface layer of the light-emitting part and the transparent supporting layer destined to be bonded to the surface thereof depends very conspicuously on the concentration of oxygen in the bonding layer. The adhesive strength decreases in accordance as the concentration of oxygen atoms in the bonding layer increases. In order that the individual devices being separated by cutting may withstand the impact of chipping without inducing separation from the bonding layer, the concentration of oxygen atoms in the bonding layer is preferably set at $1 \times 10^{20}$ atoms/cm$^3$ or less. The treatment of the surface of the outermost surface layer of the light-emitting part that is performed by the method described above manifests the effect of stably lowering the concentration of oxygen in the bonding layer to below the concentration of atoms. If the oxygen atoms are present in the bonding layer in a large amount exceeding the concentration of $1 \times 10^{20}$ atoms/cm$^3$, the bonding strength will decrease conspicuously. For this reason, the separation of individual devices by cutting, for example, will be at a disadvantage in suffering the transparent supporting layer to peel off the outermost surface layer of the light-emitting part, preventing the devices from being normally fabricated, and so forth.

Further, when the transparent supporting layer of GaP crystal material, for example, which has undergone the wet or dry surface treatment for the removal of an oxide film is to be bonded in a high degree of vacuum to the surface of the outermost surface layer of the light-emitting part which has undergone the same surface treatment for the removal of an oxide film, the atomic concentrations of oxygen in their bonding layers can be decreased to below $1 \times 10^{20}$ atoms/cm$^3$ with still better reproducibility. Alternatively mentioned, the outermost surface layer of the light-emitting part and the supporting layer together form a bonding layer of great bonding strength. Further, by performing the bonding in a vacuum, it becomes possible for the necessity of an environment of very high cleanliness needed in effecting the bonding in air to be obviated and the fabrication to be accomplished stably and inexpensively.

When the outermost surface layer of the light-emitting part and the transparent supporting layer, besides satisfying the decrease of oxygen concentration, are bonded in such a manner that carbon (C) or an impurity containing carbon may not persist on their surfaces being bonded (bonding surfaces), they can be bonded strongly. When the surfaces to be bonded, after undergoing the surface treatment for the removal of oxide film, are bonded without undergoing a final cleaning using an organic solvent, such as methanol ($CH_3OH$), ethanol ($C_2H_5OH$) or acetone ($CH_3COCH_3$), the concentration of carbon atoms in the bonding layer can be decreased. By not finally subjecting the surfaces being bonded to a gas phase etching using a carbon-containing substance, such as carbon tetrachloride ($CCl_4$), it is made possible for the produced bond to excel in strength.

Particularly, it is enabled to form a strong bond by having the concentration of carbon atoms in the bonding layer set at $1 \times 10^{20}$ atoms/cm$^3$ or less. Further, when the outermost surface layer of the light-emitting part and the transparent supporting layer are bonded in a vacuum of high degree of $1 \times 10^{-4}$ Pa or less, for example, a bond possessing high bonding strength and having the concentration of carbon atoms in the bonding layer set at $1 \times 10^{19}$ atoms/cm$^3$ or less is obtained. By decreasing the atomic concentrations of oxygen and carbon in the bonding layer, it is made possible not only to form a strong bond but also to suppress the introduction of a crystal defect in the bonding layer and consequently avoid uncalled-for aggravation of electric resistance in the direction of flow of the electric current for operating the device (device operating current). As a result, a compound semiconductor light-emitting diode (LED) exhibiting a low forward voltage (Vf) and a small leak current via a crystal defect and abounding in reverse voltage can be configured. The atomic concentrations of oxygen and carbon can be determined by an analytic means, such as the Secondary Ion Mass Spectrometry (SIMS) or the Auger Electron Spectroscopy (AES).

The transparent supporting layer to be bonded to the outermost surface layer of the light-emitting part is formed of an optically transparent material which possesses strength sufficient for mechanically supporting the light-emitting part and forms a forbidden band wide enough to allow transmission of the light emitted from the light-emitting part. It can be formed, for example, of a Group III-V compound semiconductor crystal material, such as gallium phosphide (GaP), aluminum-gallium arsenide (AlGaAs) or gallium nitride (GaN), a Group II-VI compound semiconductor crystal material, such as zinc sulfide (ZnS) or zinc selenide (ZnSe), or a Group IV compound semiconductor crystal material, such as a hexagonal or cubic silicon carbide (SiC), for example. The transparent supporting layer preferably has a thickness of about 50 μm or more so that it may be capable of supporting the light-emitting part with mechanically sufficient strength. It preferably has a thickness not exceeding about 300 μm so that the mechanical work to be performed on the transparent supporting layer after being bonded may be facilitated. In the compound semiconductor LED provided with a light-emitting layer formed of $(Al_XGa_{1-X})_YIn_{1-Y}P$ ($0 \leq X \leq 1$, $0 < Y \leq 1$), it is most favorable to have the transparent supporting layer formed of a GaP single crystal material having a thickness of about 50 μm or more and about 300 μm or less.

When a transparent supporting layer formed of gallium phosphide (GaP), for example, is disposed as bonded to the outermost surface layer of the light-emitting part, the formation of the outermost surface layer of the light-emitting part with a Group III-V compound semiconductor material having a different lattice constant from the other Group III-V compound semiconductor layers constituting the light-emitting part results in manifesting a function of relaxing the stress exerted on the light-emitting part while the transparent supporting layer is bonded thereto. As a result, it is made possible to prevent the light-emitting layer from sustaining damage during the course of bonding and contribute to permission of stable supply of a compound semiconductor LED capable of emitting a light in an expected wavelength, for example. The outermost surface layer of the light-emitting part preferably has a thickness of 0.5 μm or more in order to sufficiently relax the stress exerted on the light-emitting part while the transparent supporting layer is being bonded thereto. When the thickness of the outermost surface layer is unduly increased, the exertion of stress on the light-emitting layer inevitably occurs while the outermost surface layer is being disposed on account of the difference of the lattice constant from the other component layers of the light-emitting part. For the purpose of avoiding this hardship, the thickness of the outermost surface layer is preferably set at 20 μm or less.

Particularly, when gallium phosphide (GaP) is selected for the transparent supporting layer which proves to be convenient for the sake of transmitting to the exterior the light emitted from the light-emitting part formed of $(Al_XGa_{1-X})_YIn_{1-Y}P$ ($0 \leq X \leq 1$, $0 < Y \leq 1$), the formation of the outermost surface layer of the light-emitting part with a semiconductor material having gallium (Ga) and phosphorus (P) as component elements and containing Ga in a larger amount than P enables the bond to be formed strongly. It is particularly preferable to have the outermost surface layer formed of $Ga_XP_{1-X}$ ($0.5 < X < 0.7$) of a nonstoichiometric composition.

The surface of the transparent supporting layer and the surface of the outermost surface layer of the light-emitting part that are ready to be bonded are each formed of a single crystal and are preferably in the same plane direction. Preferably, the two surfaces both constitute a (001) face. For the purpose of obtaining the outermost surface layer of the light-emitting part which has a (001) face for the surface thereof it suffices to use a substrate having a (001) face for the surface thereof when the outermost surface layer of the light-emitting part is to be bonded on the substrate. By using as the substrate a gallium arsenide (GaAs) single crystal having a (001) face as the surface thereof, it is made possible to form the outermost surface layer of the light-emitting part that has a (001) face as the surface thereof.

The light-emitting part can be formed on the surface of a substrate of a Group III-V compound semiconductor single crystal, such as gallium arsenide (GaAs), indium phosphide (InP) or gallium phosphide (GaP), or a silicon (Si) substrate.

The light-emitting part is preferably formed in a double hetero (DH) structure capable of confining the carrier and the emission of light which are responsible for the radiation combination as mentioned previously. The light-emitting layer, with the object of obtaining light emission excelling in monochromaticity, is preferably formed in a Single Quantum Well (SQW) structure or a MultiQuantum Well (MQW) structure. As concrete examples of the means for forming the component layers of the light-emitting part, the method for MetalOrganic Chemical Vapor Deposition (MOCVD), the method of Molecular Beam Epitaxy (MBE) and the method of Liquid Phase Epitaxy (LPE) may be cited.

Between the substrate and the light-emitting part, a buffer layer responsible for the action of relaxing the lattice mismatch between the material of the substrate and the component layers of the light-emitting part, a Bragg reflection layer intended to reflect the light emitted from the light-emitting layer to the exterior of the device, and an etching stop layer utilized for selective etching are interposed. Further, the component layers of the light-emitting part may be provided thereon with a contact layer for lowering the contact resistance of an ohmic electrode, a current diffusion layer for inducing planar diffusion of a device operating current wholly in the light-emitting part, a current inhibition layer for conversely restricting the region that permits flow of the device operating current, a current constriction layer, etc.

By first causing the surface of the transparent supporting layer and the surface of the outermost surface layer of the light-emitting part which are ready to be bonded to be equalized in plane direction and then further causing them to form a planar azimuth difference within 20 degrees in angle with respect to a specific crystal direction, it becomes possible to form a strong bond. The surfaces are preferably bonded after they have parallelized (azimuth difference=0 degree) the <110> direction of the gallium phosphide (GaP) single crystal material used for the transparent supporting layer, for example, and the <110> direction of the nonstoichiometeric composition $Ga_XP_{1-X}$ ($0.5 < X < 0.7$) forming the outermost surface layer of the light-emitting part, for example. The fact that the surfaces are so bonded as to avoid occurrence of a difference in azimuth with respect to a specific crystal direction proves to be most convenient for the purpose of lowering the electric resistance in the interface. If the difference in azimuth on one plane increases beyond 20 degrees, the excess will result in adding to resistance.

Further, particularly strong bonding can be accomplished when the surface of the transparent supporting layer or of the outermost surface layer of the light-emitting part to which the supporting layer is to be bonded has flatness of 0.3 nm or less in root-mean-square (rms) value. The surface of such flatness as this can be obtained, for example, by the Chemical Mechanical Polishing (CMP) means that uses an abrasive containing silicon carbide (SiC)-based micropowder or micropowder of cerium (Ce). When the surface polished by the chemical mechanical polishing means is further treated with an acid solution or an alkali solution, the treatment can contribute much to the acquisition of a clean surface by further enhancing the degree of flatness of surface and effecting removal of a foreign matter or a polluting matter suffered to adhere to the surface during the course of polishing.

The transparent supporting layer or the outermost surface layer of the light-emitting part is subjected to the bonding in vacuum of $1 \times 10^{-2}$ Pa or less and preferably $1 \times 10^{-3}$ Pa or less in pressure. A particularly strong bond can be formed by mutually bonding the two flat surfaces that have been polished as described above. It is important that the two surfaces, prior to being mutually bonded, be activated by being individually irradiated with an atom beam or ion beam possessing energy of 50 eV or more. The term "activation" refers to the creation of surfaces in a clean state by depriving the two surfaces being bonded of an impurity layer or a polluting layer containing an oxide film, carbon, etc. and existing on the surfaces. By performing this irradiation on the surface of either the transparent supporting layer or the component layers of the light-emitting part, the two surfaces are strongly bonded infallibly. By performing the irradiation on both the surfaces, they can be bonded with still greater strength.

As concrete examples of the source of irradiation that proves effective in inducing a strong bond, beams of hydrogen (H) atom, hydrogen molecule ($H_2$) and hydrogen ion (proton: $H^+$) may be cited. By radiating a beam containing an element that exists in the surface region about to be bonded, a bond excelling in strength can be formed. When gallium phosphide (GaP) having zinc (Zn) added thereto is to be used for the transparent supporting layer, for example, the irradiation of the surface being bonded with an atom or ion beam containing gallium (Ga), phosphorus (P) or zinc (Zn) results in enabling formation of a strong bond. When the surfaces of the transparent supporting layer and the outermost surface layer of the light-emitting part abound in electric resistance, however, the irradiation of these surfaces with a beam mainly containing ions possibly results in electrifying the surfaces. When this electrification of the surfaces causes an electrical repulsion, the formation of a strong bond cannot be attained. The activation of the surfaces by the radiation of an ion beam, therefore, is preferably utilized for the purpose of activating such surfaces as are excellent in electric conductivity.

On the surface region of the transparent supporting layer or the component layers of the light-emitting part, the activation of the surface can be stably fulfilled by using the beam of an inert gas selected from among helium (He), neon (Ne), argon (Ar) and krypton (Kr) which are incapable of exerting a conspicuous change such as on the composition of the surface region. The use of the beam of argon (Ar) atom (mono-atomic molecule) among other inert atoms enumerated above proves to be convenient because it is capable of easily activating the surface in a short time. Helium (He) has a smaller atomic weight than argon (Ar). The beam of He, therefore, is at a disadvantage in wasting time while it is being used for activating the surface ready to be bonded. Meanwhile, the use of the beam of krypton (Kr) that has a larger atomic weight than argon proves inconvenient because it is quite capable of inflicting damage of impact on the surface.

When the surfaces of the transparent supporting layer and the outermost surface layer of the light-emitting part are stacked as opposed to each other and are consequently readied for bonding, the measure adopted for enabling applied mechanical pressure to cover wholly the surfaces being bonded proves convenient for strongly bonding both the surfaces. To be specific, pressure of 5 $g \cdot cm^{-2}$ or more and 100 $g \cdot cm^{-2}$ or less is applied in a perpendicular direction to the surfaces being bonded. This method manifests the effect of fulfilling the bonding with uniform strength even when the transparent supporting layer or the outermost surface layer of the light-emitting part or both happen to be warped.

The transparent supporting layer and the light-emitting part are bonded in a vacuum of the preferred degree mentioned above while the temperature of the surface of the supporting layer or the light-emitting part or both is set at 100° C. or less, preferably at 50° C. or less, and more preferably at room temperature. When the bonding is performed in an environment of high temperature exceeding about 500° C., the light-emitting layer formed of $(Al_XGa_{1-X})_YIn_{1-Y}P$ ($0 \leq X \leq 1, 0 < Y \leq 1$) and provided for the light-emitting part is thermally denatured. This proves to be inconvenient for stably obtaining a compound semiconductor LED capable of emitting a light of an expected wavelength.

By bonding the supporting layer to the outermost surface layer of the light-emitting part, reducing it to a state capable of mechanically supporting the light-emitting part, and subsequently removing the substrate utilized for forming the light-emitting part, it is made possible to enhance the efficiency of extraction of the emitted light to the exterior and permit configuration of a compound semiconductor LED of high luminance. Particularly when an optically nontransparent material inevitably suffered to absorb the light from the light-emitting layer of $(Al_XGa_{1-X})_YIn_{1-Y}P$ ($0 \leq X \leq 1, 0 < Y \leq 1$) is used as the substrate, the means for removing the substrate in such a manner can contribute much to stable fabrication of an LED of high luminance. When a layer such as, for example, the buffer layer formed of a material absorbing the light emitted from the light-emitting part intervenes between the substrate and the light-emitting part, the removal of this intervening layer in conjunction with the substrate proves advantageous for enhancing the luminance of the LED. For the removal of the substrate, mechanical cutting work, abrasion, physical dry or chemical wet etching, etc. are available either singly or in combination. Particularly by the selective etching means that utilizes the difference in etching speed between materials, it is made possible to effect selective removal of the substrate solely and enable the substrate to be removed uniformly with high reproducibility.

When the light-emitting part is formed on a substrate made of an optically transparent and electrically insulating material that is incapable of absorbing the light emitted from the light-emitting layer, the removal of this insulating substrate enables configuration of a compound semiconductor LED of a simple structure which is capable of passing the device operating current in the (plumb-bob) vertical direction. By causing the interface between the insulating substrate and the semiconductor layer lying directly on the surface of the substrate to be concentrically irradiated with a laser beam, for example, after the light-emitting part has been mechanically supported by being bonded to the transparent supporting layer, for example, the substrate is enabled to be peeled off the semiconductor layer lying directly thereon. Then, a unipolar ohmic electrode is formed on the surface of the electrically conductive semiconductor layer that has been exposed in consequence of the separation of the substrate. Meantime, an ohmic electrode of the other polarity is formed on the surface of the supporting layer that has been bonded so as to support the light-emitting part. When the ohmic electrodes are disposed in such a manner as described above, since the electrodes of both polarities are disposed on one surface side and the necessity of removing the light-emitting part is consequently obviated, the area for emitting light is increased to the extent of contributing much to the fabrication of a compound semiconductor LED convenient for materializing the emission of light of high luminance.

For example, when the so-called flip chip type diode structure obtained by causing a transparent substrate to serve as a surface for extraction of light, forming a first electrode on the surface of a semiconductor layer stripped of the substrate and an electrode on a semiconductor layer of the second polarity after removing part of the semiconductor layer, and further disposing a metallic reflection layer adapted to cover the surfaces of the first electrode and the semiconductor layer is enabled to utilize the reflection layer for enhancing the efficiency of extraction of light, the structure consequently fabricated brings an optimum advantage. The fabrication of an LED lamp of high luminance can be accomplished by having a light-emitting diode of this structure incorporated in a package.

EXAMPLE

In the present example, this invention will be specifically described by citing the case of fabricating a light-emitting diode by bonding an epitaxially stacked structure disposed on a GaAs substrate and a GaP supporting layer.

Figure 2:
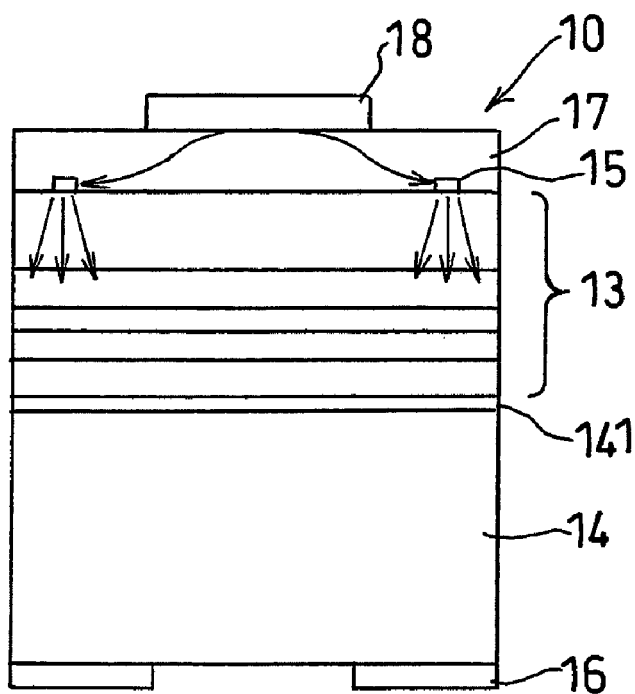
FIG. 2 is a cross section taken through FIG. 1 along line II-II.
Figure 3:
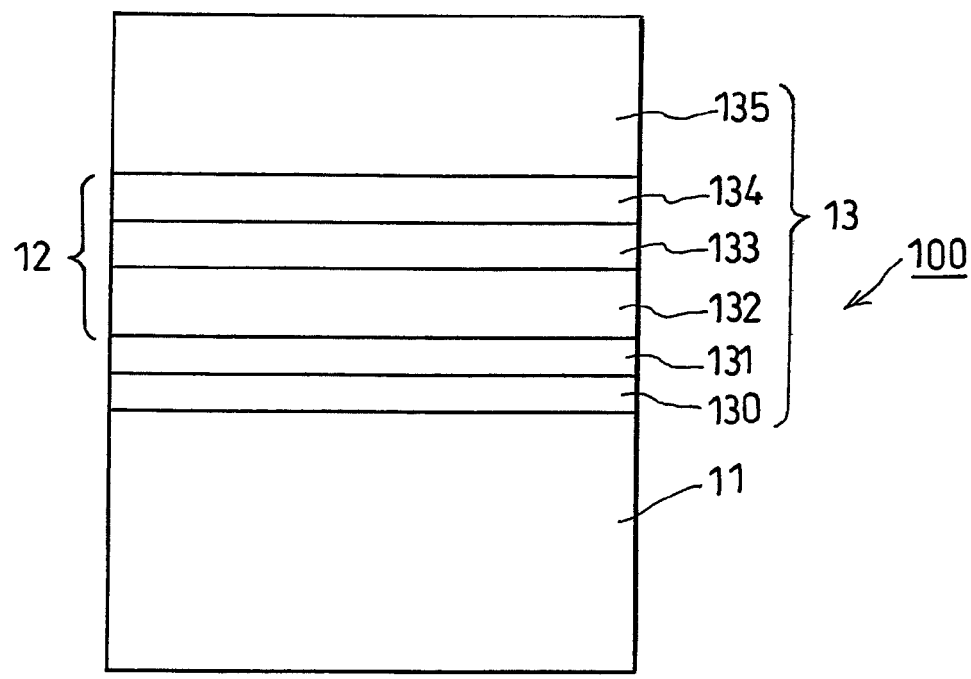
FIG. 3 is a schematic view of the component layers of an epitaxially stacked structure to be used in a semiconductor light-emitting diode.

FIG. 1 and FIG. 2 are schematic diagrams illustrating a semiconductor light-emitting diode fabricated in the present example; FIG. 1 is a plan view thereof and FIG. 2 is a cross section taken through FIG. 1 along line II-II. FIG. 3 is a schematic diagram of the layer structure of an epitaxially stacked structure used in the semiconductor light-emitting diode and FIG. 4 is a schematic diagram of the layer structure of the epitaxially stacked structure in a state having a supporting layer bonded thereto.

It is an AlGaInP red light-emitting diode (LED) that was fabricated in the present example.

Figure 4:
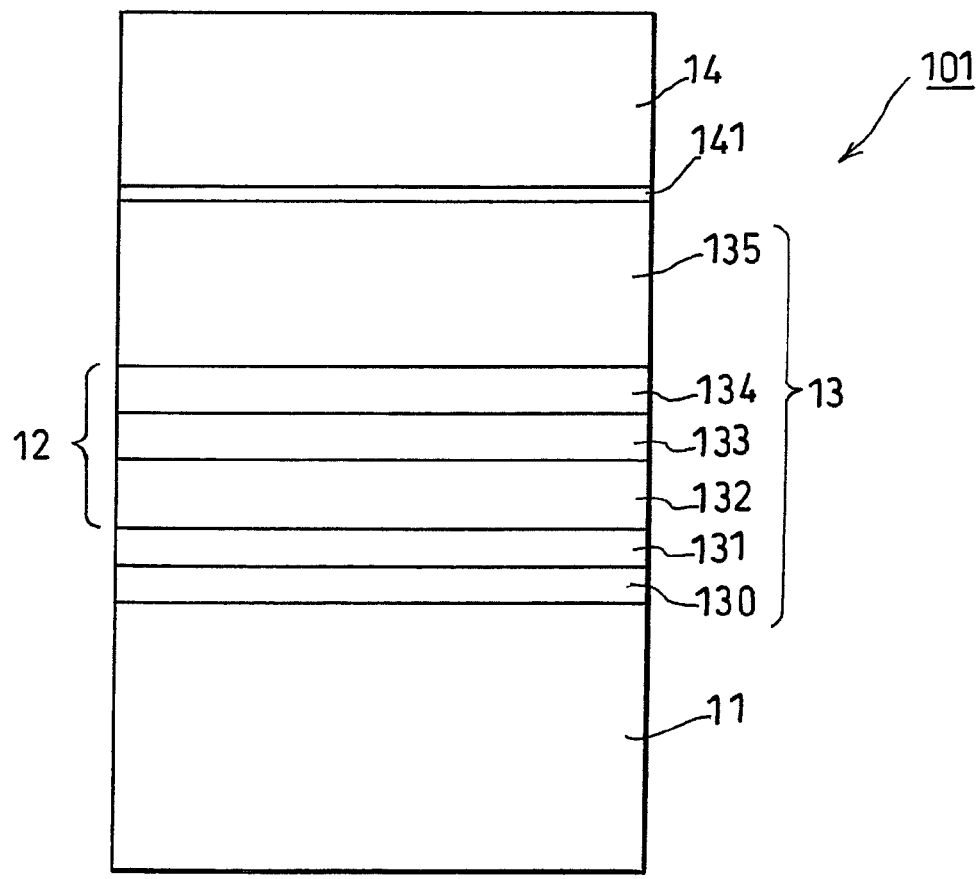
FIG. 4 is a schematic view of the component layers of an epitaxially stacked structure in a state having a supporting layer bonded thereto.

An LED (LED chip) 10 shown in FIG. 1 and FIG. 2 was fabricated by using an epitaxially stacked structure 101 provided with semiconductor layers 13 sequentially stacked on a semiconductor substrate 11 formed of an Si-doped n-type GaAs single crystal possessing a surface inclined by 15° from the (100) plane and a p-type GaP substrate (transparent supporting layer) 14 bonded thereto as shown in FIG. 4.

For a start, such an epitaxially stacked structure 100 as shown in FIG. 3 was fabricated. This epitaxially stacked structure 100 was composed of the substrate 11 and the stacked semiconductor layers 13.

The stacked semiconductor layers 13 were a buffer layer 130 formed of a Te-doped n-type GaAs, a contact layer 131 formed of a Te-doped n-type $(Al_{0.5}Ga_{0.5})_{0.5}In_{0.5}P$, a lower clad layer 132 formed of a Te-doped n-type $(Al_{0.7}Ga_{0.3})_{0.5}In_{0.5}P$, a light-emitting layer 133 formed of 20 pairs of undoped $(Al_{0.2}Ga_{0.8})_{0.5}In_{0.5}P/Al_{0.7}Ga_{0.3})_{0.5}In_{0.5}P$, an upper clad layer 134 formed of an Mg-doped p-type $(Al_{0.7}Ga_{0.3})_{0.5}In_{0.5}P$ and an Mg-doped p-type GaP layer 135. The upper clad layer 134 is provided thereon with a thin film formed of $(Al_{0.5}Ga_{0.5})_{0.5}In_{0.5}P$. A light-emitting part 12 of the LED 10 assumes a p-n junction-type double hetero bond structure that is composed of the lower clad layer 132, the light-emitting layer 133 and the upper clad layer 134.

In the present example, the individual semiconductor layers 130 to 135 constituted an epitaxial wafer formed as stacked on the GaAs substrate 11 by the low-pressure MetalOrganic Chemical Vapor Deposition method (MOCVD method) using trimethyl aluminum $((CH_3)_3Al)$, trimethyl gallium $((CH_3)_3Ga)$ and trimethyl indium $((CH_3)_3In)$ as raw materials for Group III component elements. As the raw material for the Mg doping, biscyclopentadiethyl magnesium (bis-$(C_5H_5)_2Mg$) was used. As the raw material for the Te doping, dimethyl tellurium $((CH_3)_2Te)$ was used. Then, as the raw material for a Group V component element, phosphine ($PH_3$) or arsine ($AsH_3$) was used. The GaP layer 135 was grown at 750° C. and the other semiconductor layers 130 to 134 forming the semiconductor layer 13 were grown at 730° C.

The GaAs buffer layer 130 had a carrier concentration of about $5\times10^{18}$ cm$^{-3}$ and a layer thickness of about 0.2 µm. The contact layer 131 was formed of $(Al_{0.5}Ga_{0.5})_{0.5}In_{0.5}P$ and had a carrier concentration of about $2\times10^{18}$ cm$^{-3}$ and a layer thickness of about 1.5 µm. The n-clad layer 132 had a carrier concentration of about $8\times10^{17}$ cm$^{-3}$ and a layer thickness of about 1 µm. The light-emitting layer 133 was not doped and had a layer thickness of 0.8 µm. The p-clad layer 134 had a carrier concentration of about $2\times10^{17}$ cm$^3$ and a layer thickness of 1 µm. The GaP layer 135 had a carrier concentration of about $3\times10^{18}$ cm$^{-3}$ and a layer thickness of 9 µm. The p-type GaP layer 135 on the outermost surface layer of the light-emitting part 12 had a region reaching a depth of about 1 µm from the first surface polished and subjected to mirror finishing. By the mirror finishing, the surface of the p-type GaP layer 135 was given roughness of 0.18 nm.

The p-type GaP substrate 14 (FIG. 4) was prepared as a transparent supporting layer to be affixed to the mirror polished surface of the p-type GaP 135. The GaP substrate 14 ready to be affixed had Zn added thereto so as to acquire a carrier concentration of about $2\times10^{18}$ cm$^{-3}$. A single crystal having a plane direction of 15° off (100) was used. The GaP substrate 14 to be affixed had a diameter of 50 mm and a thickness of 250 µm. This GaP substrate 14, prior to being bonded to the p-type GaP layer 135, had the surface thereof mirror-polished and finished till 0.12 mn in the rms value.

The GaP substrate 14 and the epitaxially stacked structure 100 were carried into an ordinary semiconductor material affixing device, and the semiconductor material affixing device was then evacuated to a vacuum of $3\times10^{-5}$ Pa. Thereafter, in the semiconductor material affixing device which had excluded members made of carbon materials with a view to avoiding pollution with carbon, the GaP substrate 14 and the epitaxially stacked structure 100 mounted therein were kept heated to a temperature of about 800° C. in the vacuum while the surface of the GaP substrate 14 was irradiated with Ar ions accelerated to an energy of 800 eV. Consequently, a bonding layer 141 having a nonstoichiometric composition was formed on the surfaces of the GaP substrate 14 and the epitaxially stacked structure 100. Subsequent to the formation of the bonding layer, the radiation of Ar ions was discontinued and the temperature of the GaP substrate 14 was lowered to room temperature.

Then, the surfaces of both the GaP substrate 14 possessing in the surface region the bonding layer 141 made of a nonstoichiometric composition and the GaP layer 135 were irradiated over a period of 3 minutes with an Ar beam neutralized by bombardment with electrons. Thereafter, in the semiconductor material-affixing device maintained at a vacuum, the surfaces of both the layers 135 and 14 were overlapped as illustrated in FIG. 4 and severally loaded with a pressure till 20 g/cm$^2$, and mutually bonded at room temperature. When a wafer resulting from the bonding was removed from the vacuum chamber of the semiconductor material affixing device and the interface of bonding in the wafer was analyzed, the bonding layer 141 formed of a nonstoichiometric composition of $Ga_{0.6}P_{0.4}$ was detected in the bonded parts. The bonding layer 141 had a thickness of about 3 nm, the concentration of oxygen atoms in the bonding layer 141 determined by the ordinary method of SIMS analysis was $7\times10^{18}$ cm$^{-3}$, and the concentration of carbon atoms was $9\times10^{18}$ cm$^{-3}$.

The back surface of the affixed GaP substrate 14 that lay opposite the surface of bonding was clad by the ordinary method of vacuum deposition with a multi-layered film composed of a gold-beryllium (AuBe) alloy film having a thickness of 0.2 µm and an Au film having a thickness of 0.8 µm. Then, the multi-layered film was processed by the ordinary means of photolithography to form patterns, and the patterns of multi-layered film measuring 50 µm in diameter and assuming a circular shape in the plan view were regularly arrayed like lattice points separated by a distance of 150 µm. Subsequently, these circular patterns of multi-layered film were subjected to a heat treatment performed at 450° C. for 10 minutes so as to be alloyed and transformed into a p-type ohmic electrode 16 of low contact resistance.

Then, the GaAs substrate 11 and the GaAs buffer layer 130 were selectively removed with an ammonia-based etchant. On the exposed surface of the contact layer 131, an AuGe/Ni alloy film measuring 0.2 µm in thickness and an Au film measuring 0.1 µm in thickness were deposited by the method of vacuum deposition. By the patterning carried out by using an ordinary means of photolithography, an n-type ohmic electrode 15 was formed. Subsequently, the surface of the contact layer 131 and the surface of the n-type ohmic electrode 15 were coated with an Indium-Tin Oxide (ITO) complex film (transparent, electrically conductive film) 17 formed in a thickness of 0.5 µm by utilizing an ordinary sputtering device. Further, a chromium (Cr) thin film having a thickness of 0.03 µm and a gold (Au) thin film having a thickness of 1 µm were sequentially stacked on the ITO surface by the sputtering method and, thereafter, a bonding electrode 18 having a diameter of 110 µm was formed.

Then, the LED chips 10 of a nearly square shape in the plan view were formed by crucially inserting cuts at intervals of 250 µm by utilizing an ordinary dicing saw. Incidentally, subsequent to the dicing work, the side faces of the LED chips were etched with a mixed sulfuric acid and hydrogen peroxide liquid for the purpose of removing such shattered layers which were fabricated by the cutting on the cut side faces of the semiconductor layers constituting the epitaxially stacked structure.

Figure 5:
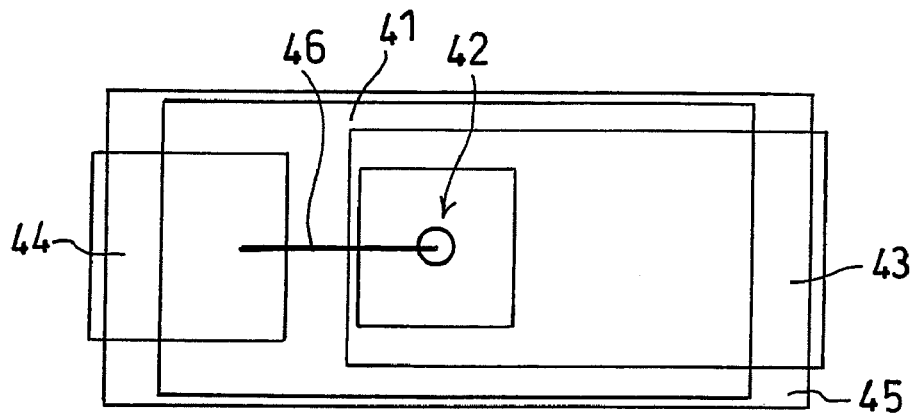
FIG. 5 is a schematic plan view illustrating the structure of an LED lamp.
Figure 6:
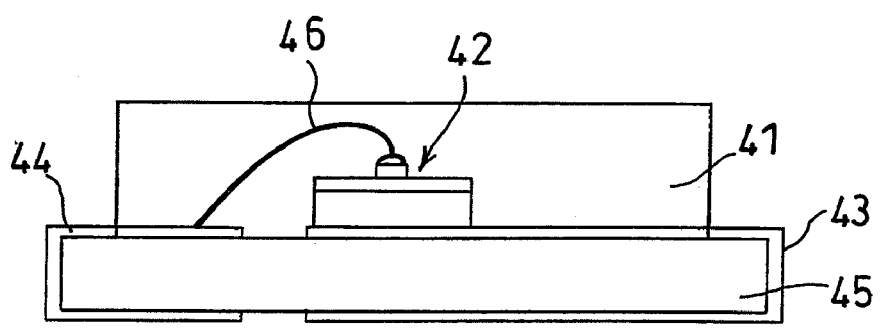
FIG. 6 is a schematic cross section illustrating the structure of the LED lamp.
Figure 7:
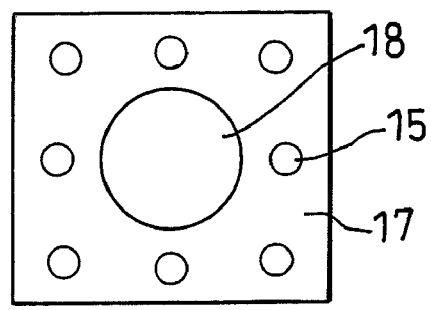
FIG. 7 is a schematic plan view illustrating the shape of an ohmic electrode.
Figure 8:
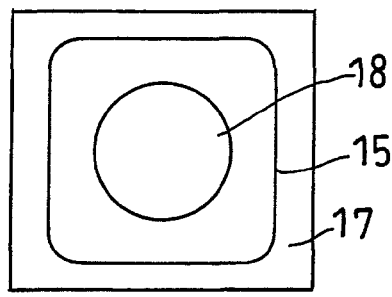
FIG. 8 is a schematic plan view illustrating the shape of another ohmic electrode.
Figure 9:
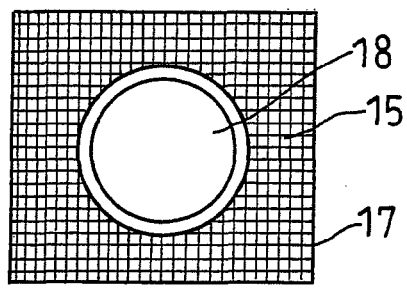
FIG. 9 is a schematic plan view illustrating the shape of a still another ohmic electrode.
Figure 10:
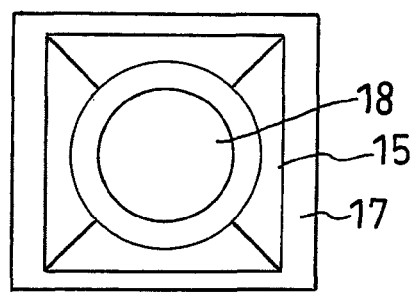
FIG. 10 is a schematic plan view illustrating the shape of a yet another ohmic electrode.
Figure 11:
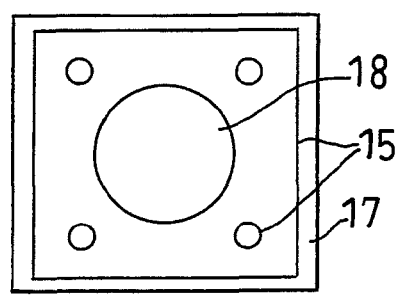
FIG. 11 is a schematic plan view illustrating the shape of a further ohmic electrode.

The LED chips 10 fabricated as described above were assembled into a light-emitting diode lamp 42 as shown by the schematic diagrams of FIG. 5 and FIG. 6. This LED lamp 42 was fabricated by being fixed and mounted on p-electrode terminals 43 disposed on the surface of the mounting substrate 45 with silver (Ag) paste and finally sealed with an ordinary epoxy resin 41, after the bonding electrodes 18 of the LED chips and n-electrode terminals 44 were subjected to wire bonding with a gold wire 46. The shear strength exerted on the bonding interface between the substrate 45 and the LED chip 10 was about 300 g or more. Since the mode of breaking consisted in the separation of individual LED chips 10, the bonding strength in the bonding interface was interpreted as exceeding the breaking strength of the crystal layers partaking in the formation of the epitaxial wafer.

The flow of an electric current between the n-type and p-type ohmic electrodes 15, 16 via the n-electrode terminal 44 and the p-electrode terminal 43 disposed on the surface of the mounting substrate 45 resulted in the emission of a light in red color having a main wavelength of 620 nm. The forward voltage (Vf) during the flow of an electric current of 20 mA in the forward direction was found to be about 2.2 V, reflecting the lowness of resistance in the bonding interface between the GaP layer 135 and the GaP substrate 14 and the good ohmic properties of the ohmic electrodes 15 and 16. The intensity of light emission during the flow in the forward direction of an electric current fixed at 20 mA was such as to manifest high luminance of 520 mcd, reflecting the fact that the efficiency of extraction of light to the exterior was enhanced as by forming a light-emitting part of high efficiency of light emission and depriving the chips of the shattered layers occurring thereon during the course of cutting.

Incidentally, while the ohmic electrode 15 was formed in the present example by reason of such a simple construction as illustrated in FIG. 1, the electrode may be formed in shapes, such as dots, lattices, circles, squares or their combinations as shown in FIG. 7 to FIG. 11. The selection of the electrode in such a pattern as is suitable for diffusion of an electric current can contribute to the fabrication of an LED possessing the characteristic properties described in this example.

Comparative Example 1

An AlGaInP LED chip was fabricated by affixing a p-type GaP substrate having no bonding layer formed on the surface thereof to a p-type GaP layer under the conditions different from those of the example cited above. In Comparative Example 1, while the p-type GaP substrate was maintained in an atmosphere of nitrogen at a temperature of 800° C. and kept continuously over one hour under such a load as to produce pressure of 200 g/cm$^2$ on the bonding surface, the surfaces of the p-type GaP substrate and the p-type GaP layer were bonded at an elevated temperature under the atmospheric pressure. In the bonding performed under the conditions described in Comparative Example 1, the presence of a large amount of crystal defects was detected in the bonding interface between the p-type GaP substrate and the p-type GaP layer.

The concentration of oxygen atoms in the interface region was $2.0 \times 10^{20}$ cm$^{-3}$ and the concentration of carbon atoms therein was $1.1 \times 10^{20}$ cm$^{-3}$, both being high concentrations. Further, the shear strength was as low as 180 g. Consequently, separation of bond occurred in the region equivalent to about 10% of the surface area of the bonding surface during the dicing step performed for the formation of chips.

The light-emitting diode chip that tolerated the impact of chipping without inducing such separation was tested for the characteristic properties of an LED. Though the LED emitted a light in red color having a main wavelength of 620 nm, the forward voltage (Vf) produced during the flow of an electric current of 20 mA in the forward direction assumed such a high magnitude as 2.6 V. Conversely, the intensity of light emission during the flow of a forward electric current fixed at 20 mA had a low magnitude of 270 mcd. These results allow an inference that the crystal defects inflicted on the bonding interface and the bonding treatment performed at an elevated temperature during the course of bonding led to deteriorating the quality of the light-emitting part and degrading the luminance.

Comparative Example 2

An AlGaInP LED chip was fabricated by affixing a p-type GaP substrate having no bonding layer formed on the surface thereof to a p-type GaP layer under the conditions different from those of the example and Comparative Example 1 cited above. In Comparative Example 2, the p-type GaP layer bonded to the p-type GaP substrate had a layer thickness of 0.3 µm. This p-type GaP layer, after having the surface thereof rinsed with hydrofluoric acid (HF), was bonded to the p-type GaP substrate and they were together subjected to a heat treatment at 500° C. so as to finish the bonding. The concentration of oxygen atoms in the bonding interface was $3 \times 10^{20}$ cm$^{-3}$ and the concentration of carbon atoms therein was $2 \times 10^{20}$ cm$^{-3}$, both being high concentrations. The shear strength was as low as 100 g. Consequently, separation of the bonding surface occurred in the region equivalent to about 40% of the surface area of the bonding surface during the dicing step performed for the formation of chips.

The LED emitted a light in red color having a main wavelength of 620 nm. The forward voltage (Vf) during the flow of an electric current of 20 mA in the forward direction was as high as 3.7 V because the resistance in the bonding interface was high. The intensity of light emission under a forward current fixed at 20 mA was 390 mcd.

INDUSTRIAL APPLICABILITY

The compound semiconductor light-emitting diode can avoid exertion of stress on the light-emitting part, suppress the occurrence of a crystal defect, enhance the bonding strength between the light-emitting part and the supporting layer, further decrease electric resistance in the bonding interface and thereby enhance the forward voltage (Vf), also heighten the reverse voltage and materialize impartation of high luminance.

The invention claimed is:

1. A compound semiconductor light-emitting diode comprising:
a light-emitting layer formed of aluminum-gallium-indium phosphide (($Al_xGa_{1-X}$)$_Y In_{1-Y}$P wherein $0 \leq X \leq 1$, $0 \leq Y \leq 1$);
component layers individually having a light-emitting part formed of a Group III-V compound semiconductor;
a transparent supporting layer bonded to an outermost surface layer of the light-emitting part and transparent to light emitted from the light-emitting layer; and
a bonding layer formed between the supporting layer and the outermost surface layer of the light-emitting part and containing oxygen atoms at a concentration of $1 \times 10^{20}$ $cm^{-3}$ or less,
wherein the outermost surface layer of the light-emitting part whose side is bonded to the supporting layer and the supporting layer are both formed of gallium phosphide (GaP), and
wherein the bonding layer has a nonstoichiometric composition represented by formula $Ga_X P_{1-X}$ wherein $0.5 < X < 0.7$.

2. A compound semiconductor light-emitting diode according to claim 1, wherein the bonding layer formed between the supporting layer and the outermost surface layer of the light-emitting part contains carbon atoms at a concentration of $1 \times 10^{20}$ $cm^{-3}$ or less.

3. A compound semiconductor light-emitting diode according to claim 1, wherein the outermost surface layer of the light-emitting layer has a different lattice constant from the component layers of the light-emitting part and has a thickness of 0.5 μm or more and 20 μm or less.

4. A compound semiconductor light-emitting diode according to claim 1, wherein the bonding layer has a thickness of 0.5 nm or more and 5 nm or less.

5. A compound semiconductor light-emitting diode according to claim 1, wherein a first electrode is formed on the other outermost surface layer of the light-emitting part, a second electrode is formed on a surface of the supporting layer, and the first electrode is composed of an ohmic electrode formed on the other outermost surface layer of the light-emitting part, a transparent, electrically conductive film formed on the ohmic electrode, and a bonding electrode is formed on the transparent, electrically conductive film.

6. A method for the fabrication of a compound semiconductor light-emitting diode comprising:
a light-emitting layer formed of aluminum-gallium-indium phosphide (($Al_xGa_{1-X}$)$_Y In_{1-Y}$P wherein $0 \leq X \leq 1$, $0 \leq Y \leq 1$);
component layers individually having a light-emitting part formed of a Group III-V compound semiconductor;
a transparent supporting layer bonded to an outermost surface layer of the light-emitting part and transparent to light emitted from the light-emitting layer; and
a bonding layer formed between the supporting layer and the outermost surface layer of the light-emitting part and containing oxygen atoms at a concentration of $1 \times 10^{20}$ $cm^{-3}$ or less,
wherein the outermost surface layer of the light-emitting part whose side is bonded to the supporting layer and the supporting layer are both formed of gallium phosphide (GaP), and
wherein the bonding layer has a nonstoichiometric composition represented by formula $Ga_X P_{1-X}$ wherein $0.5 < X < 0.7$,
said method comprising the steps of:
growing the component layers of the light-emitting part on a substrate to form the light-emitting part;
polishing the light-emitting part by mirror-polishing the outermost surface of the light-emitting part to an average roughness of 0.3 nm or less;
preparing the supporting layer separately of the light-emitting part;
irradiating one or both of the polished outermost surface layer of the light-emitting part and a surface of the supporting layer to be bonded to the light-emitting part in a vacuum with atoms or ions possessing an energy of 50 eV or more; and
bonding the polished outermost surface layer of the light-emitting part and the surface of the supporting layer.

* * * * *